US010685887B2

United States Patent
Smith et al.

(10) Patent No.: US 10,685,887 B2
(45) Date of Patent: Jun. 16, 2020

(54) METHOD FOR INCORPORATING MULTIPLE CHANNEL MATERIALS IN A COMPLIMENTARY FIELD EFFECTIVE TRANSISTOR (CFET) DEVICE

(71) Applicant: Tokyo Electron Limited, Tokyo (JP)

(72) Inventors: Jeffrey Smith, Clifton Park, NY (US); Subhadeep Kal, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/204,606

(22) Filed: Nov. 29, 2018

(65) Prior Publication Data

US 2019/0172755 A1 Jun. 6, 2019

Related U.S. Application Data

(60) Provisional application No. 62/594,350, filed on Dec. 4, 2017.

(51) Int. Cl.
*H01L 27/12* (2006.01)
*H01L 21/8238* (2006.01)
(Continued)

(52) U.S. Cl.
CPC .. *H01L 21/823807* (2013.01); *H01L 21/3065* (2013.01); *H01L 21/8221* (2013.01);
(Continued)

(58) Field of Classification Search
CPC ............ H01L 21/8221; H01L 29/1033; H01L 21/823807; H01L 29/0649; H01L 29/161;
(Continued)

(56) References Cited

U.S. PATENT DOCUMENTS 8,274,118 B2    9/2012  Xiao et al.
8,395,220 B2 *  3/2013  Chang .................... B82Y 10/00
                                                    257/368

(Continued)

FOREIGN PATENT DOCUMENTS

JP    2011-29503 A    2/2011

OTHER PUBLICATIONS

International Search Report and Written Opinion dated Mar. 22, 2019 in PCT/US2018/063615, 12 pages.

*Primary Examiner* — Vu A Vu
(74) *Attorney, Agent, or Firm* — Oblon, McClelland, Maier & Neustadt, L.L.P.

(57) ABSTRACT

A method of manufacturing a semiconductor device includes: providing a substrate having a base fin structure thereon, the base fin structure including a first stacked portion for forming a channel of a first gate-all-around (GAA) transistor, the first stacked portion including a first channel material, a second stacked portion for forming a channel of a second GAA transistor, the second stacked portion including second channel material, and a sacrificial portion separating the first stack portion from the second stack portion, wherein the first channel material, the second channel material and the sacrificial material have different chemical compositions from each other; exposing the side of the base fin structure to an isotropic etch process which selectively etches one of the first channel material, the second channel material and the sacrificial material; and forming first and second GAA gate structures around said first channel material and said second channel material respectively.

19 Claims, 13 Drawing Sheets

(51) Int. Cl.
*H01L 29/423* (2006.01)
*H01L 21/3065* (2006.01)
*H01L 21/822* (2006.01)
*H01L 29/161* (2006.01)
*H01L 27/092* (2006.01)
*H01L 29/06* (2006.01)
*H01L 29/66* (2006.01)
*H01L 29/775* (2006.01)
*H01L 27/06* (2006.01)
*H01L 29/786* (2006.01)
*H01L 29/78* (2006.01)

(52) U.S. Cl.
CPC .......... *H01L 21/823821* (2013.01); *H01L 21/823828* (2013.01); *H01L 21/823864* (2013.01); *H01L 27/0688* (2013.01); *H01L 27/092* (2013.01); *H01L 27/0922* (2013.01); *H01L 27/0924* (2013.01); *H01L 29/0673* (2013.01); *H01L 29/161* (2013.01); *H01L 29/42392* (2013.01); *H01L 29/66545* (2013.01); *H01L 29/775* (2013.01); *H01L 29/78696* (2013.01); *H01L 29/7848* (2013.01)

(58) Field of Classification Search
CPC ......... H01L 29/0673; H01L 27/0924; H01L 21/823828; H01L 21/30604; H01L 21/308; H01L 29/42392; H01L 21/823821; H01L 29/78696
USPC .............................................. 257/351
See application file for complete search history.

(56) References Cited

U.S. PATENT DOCUMENTS

| | | | |
|---|---|---|---|
| 9,219,064 B2 * | 12/2015 | Kim | ............... H01L 27/092 |
| 9,502,414 B2 | 11/2016 | Machkaoutsan et al. | |
| 9,824,936 B2 | 11/2017 | Machkaoutsan et al. | |
| 9,842,777 B2 * | 12/2017 | Witters | ............... B82Y 10/00 |
| 9,991,261 B2 | 6/2018 | Mitard | |
| 2011/0254099 A1 | 10/2011 | Xiao et al. | |
| 2015/0370947 A1 * | 12/2015 | Moroz | ............... G06F 17/5072 716/119 |
| 2016/0276484 A1 | 9/2016 | Kim et al. | |
| 2017/0033020 A1 | 2/2017 | Machkaoutsan et al. | |
| 2017/0040321 A1 | 2/2017 | Mitard | |
| 2018/0358467 A1 | 12/2018 | Kim et al. | |
| 2019/0122937 A1 * | 4/2019 | Cheng | ............... H01L 21/02532 |

* cited by examiner

US 10,685,887 B2

METHOD FOR INCORPORATING MULTIPLE CHANNEL MATERIALS IN A COMPLIMENTARY FIELD EFFECTIVE TRANSISTOR (CFET) DEVICE

INCORPORATION BY REFERENCE

This present disclosure claims the benefit of U.S. Provisional Application No. 62/594,350, filed on Dec. 4, 2017, which is incorporated herein by reference in its entirety.

FIELD OF THE INVENTION

The present disclosure relates to a method of manufacturing a semiconductor device such as an integrated circuit, and transistors and transistor components for an integrated circuit.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

During manufacture of a semiconductor device, various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which devices, transistors, and standard cells are stacked on top of each other as a means to continue scaling. Fabrication of 3D semiconductor devices poses many new and unique challenges associated with new process integrations, novel hardware and process capability, design, post-fabrication processing, electronic design automation, as well as other aspects of the 3D fabrication process.

SUMMARY

In one embodiment, a method of manufacturing a semiconductor device includes: providing a substrate having a base fin structure thereon, the base fin structure including a first stacked portion for forming a channel of a first gate-all-around (GAA) transistor, the first stacked portion comprising first channel material, a second stacked portion for forming a channel of a second GAA transistor, the second stacked portion comprising second channel material, and a sacrificial portion separating the first stack portion from the second stack portion provided between upper and lower portions of second sacrificial material such that the first channel material, second channel material and sacrificial material are exposed at a side of the base fin structure, wherein the first channel material, the second channel material and the sacrificial material have different chemical compositions from each other; exposing the side of the base fin structure to an isotropic etch process which selectively etches one of the first channel material, the second channel material and the sacrificial material relative to the other two of the first channel material, the second channel material and the sacrificial material; and forming first and second GAA gate structures around said first channel material and said second channel material respectively.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1A:
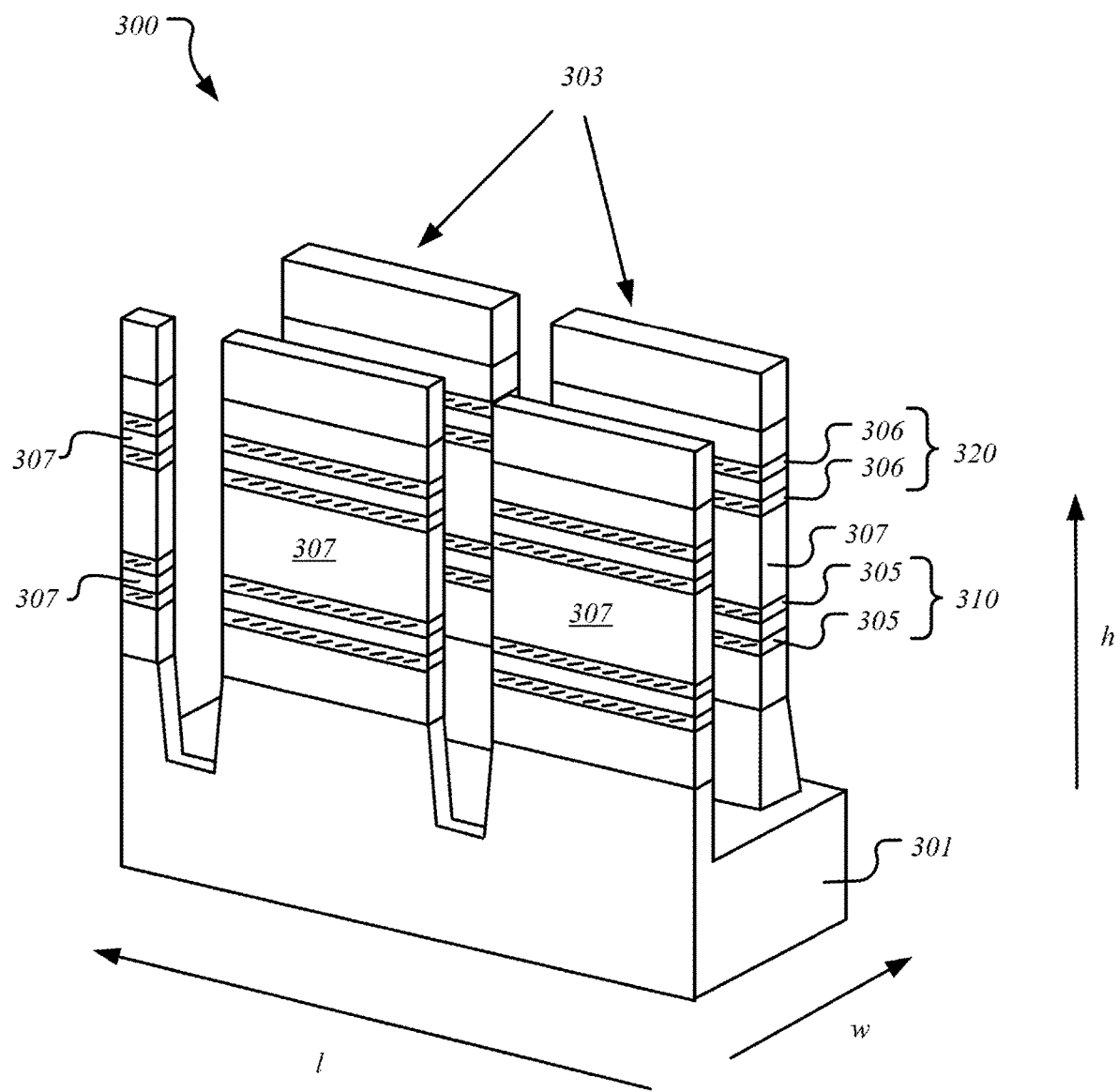
FIG. 1A shows an isometric view of a nanowire/nanosheet FET structure according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that although example embodiments herein focus on silicon and silicon-germanium, this focus is for convenience and is not limiting. Techniques herein can also be used with any epitaxially grown materials, or doped versions thereof. This includes Si, P-doped Si, B-doped Si, SiGe, doped-SiGe, Ge, and any other doped or un-doped epitaxially grown channel materials. Techniques herein can achieve sufficient etch selectively for successful material recess and wire/sheet release processes using vapor phase etching or chemical oxide removal (COR) processes.

As functional scaling is ever decreasing the size of nanowires and/or nanosheets to enable area scaling, a significant challenge lies within the drive current of a given device. For fin field-effect transistor (FINFET) devices, strain can be applied to the pMOS and nMOS devices individually through selection of different source and drain (S/D) or even channel materials in order to improve electron mobility. For the case of nanowire/nanosheet processes, drive current can be improved and control in field-effect transition devices can be improved through incorporation of different materials in the n-type metal-oxide-semiconductor (NMOS) and p-type metal-oxide-semiconductor (PMOS) channels to provide strain on the wire and/or nanosheets. The challenge with device-on-device or transistor-on-transistor stacking arises when attempting to fabricate the two devices from different materials as they are laterally stacked overtop one another, whereas for FINFET and standard nanowire/nanosheet devices, there is a p/n separation which can allow unique processing between the nMOS and pMOS channels. For complimentary FET (CFET) devices, the nMOS and pMOS devices are stacked directly overtop one another. Moreover, for particular designs, varying a thickness of different channel materials can result in different electrical performance.

For FET devices, an NMOS channel can be formed from a material such as single crystal silicon and a PMOS channel can be formed from a material such as SiGe. With some methods of nanowire and nanosheet device manufacturing in which nMOS and pMOS channels are formed from unique FIN structures which are separated by a p/n separation distance, the NMOS and PMOS can be binary with respect to material selection of the wires and the release material, even if they are the opposite between NMOS (Si wire with SiGe release) and PMOS (SiGe wire with Si release). During the Si/SiGe stack build-up using epitaxial depositions, either the NMOS or PMOS targeted areas can be etched during the epitaxial deposition sequence in order to provide a height mis-match to produce Si or SiGe nanowires or nanosheets for a given height. During the nanowire/nanosheet wire release process in which the channels are freed from the complimentary material in the starting FIN structure, the nMOS starting FIN structure can be blocked while the nanowire release process in done on the pMOS FIN, and vice-versa.

During nanowire processing, an NMOS section can be treated differently than a PMOS section. For example, for NMOS processing, SiGe can be recessed into a low-k gate spacer to have residual silicon wires or nanosheets protrude through the low-k gate spacer. Conversely, for PMOS processing, silicon can be selectively recessed into the low-k gate spacer to have SiGe wires protrude through the low-k gate spacer. During a wire release process in the replacement gate, NMOS gates can have SiGe removed leaving Si wire or nanosheets. In PMOS gates, silicon can be removed to produce desired SiGe wires.

Techniques herein effectively work for FET devices because NMOS and PMOS are typically separated from one another, even if both transistors are within a common physical gate structure. For the case of separate nMOS and pMOS physical gates, the pMOS transistor can easily be physically isolated from the nMOS transistor through incorporation of a dielectric cut placed between the two physical gates. For application of nMOS and pMOS transistors within the same physical or "common" gate, the p/n separation between the nMOS and pMOS transistors can often be adequately wide enough to enable unique processing on individual nMOS and pMOS transistors.

When NMOS and PMOS channels exist as wires or sheets with different lateral or vertical orientations with respect to one another, the processing can also be straight forward for FET designs because NMOS and PMOS will exist within separate active areas and thus can be processed individually from one another provided that there is adequate p/n separation distance between the nFET and pFET active areas.

Techniques herein help enable fabrication of three-dimensional semiconductor devices including logic devices. In one embodiment, a method provides multiple channel materials within a complementary field effective transistor device (CFET) in which PMOS or NMOS nanowires and/or nanosheets are stacked overtop their complementary counterparts. Semiconductor devices are typically fabricated on substrates, for example a single crystal silicon wafer, having a working surface on which devices are formed. By "overtop" each other, PMOS and NMOS nanowires or nanosheets are formed in a plane perpendicular to the working surface of the substrate. In one embodiment, a method herein provides for different vertical or lateral orientations of the NMOS and PMOS channels that are composed of different epitaxially grown crystal materials.

Techniques herein are applicable for device fabrication of random and non-random logic using nanowires or nanosheets. There are several embodiments, alternatives, and advantages herein. Embodiments can include a trinary or even higher order matrix of epitaxially grown crystal materials that function as multiple channel materials within a CFET device in which PMOS and NMOS channels exist overtop each other. An etching method herein provides required selectivity to recess an epitaxially grown material selective to either NMOS or PMOS channel materials into a low-k dielectric gate spacer with adequate etch selectivity in an isotropic manner such that stacked wires or sheets can be formed either sequentially or simultaneously. An etching method herein includes etching in which either PMOS or NMOS wire/sheet release is executed within a replacement gate in which a filling epitaxial material is etched isotropically with very high selectivity to preserve the NMOS and PMOS channel materials.

A deposition method can be executed in which vertically-stacked wires or sheets can be formed through thick epitaxial growths and exist within a material matrix such that it is bordered on the bottom and top of itself by another material in the epitaxially grown selectivity matrix. Techniques include a method in which the above described thick, epitaxially grown film can be "trimmed" with respect to the materials on the upper and lower sides. Trimming can be executed such that a thin sheet or wire is produced. Such a nanosheet can have a longitudinal axis extending in a horizontal (xy-plane) direction and a rectangular cross section of the nanosheet. With the rectangular cross-section, when the longer side of the rectangle extends in the xy-plane while the shorter side extends in the z-plane, this is horizontally oriented. When the longer side of the rectangle extends in the z-plane while the shorter side extends in the xy-plane, this is vertically oriented. Nanosheets of various orientations or rotations can be positioned vertically above each other in various arrangements.

FIG. 1A shows an example structure to which techniques of the present disclosure may be provided. As seen, the structure 300 includes a substrate 301 having base fin structures 303 thereon. Each base fin structure 303 includes alternating layers of a first channel material 305, a sacrificial material 307, and a second channel material 306 stacked in a height direction h within the base fin 303. The base fin structures 303 are spaced laterally along a width direction w of the substrate 301, as well as along the length direction l. Each base fin structure 303 can be used to form one or more first gate-all-around (GAA) transistors. In the example structure of FIG. 1A, base fin structures 303 each include a first stacked fin portion 310 for forming a channel region of a first GAA transistor, and a second stacked fin portion 320 for forming a channel region of a second GAA transistor. The first and second stacked fin portions 310, 320 each include an initial volume of channel material 305, 306 provided between lower and upper portions of sacrificial material 307. The sacrificial material 307 can separate the first stacked fin portion 310 from the second stacked fin portion 320. The first channel material 305, second channel material 306, and sacrificial material 307 can be exposed at a side of the base fin structure 303 and have different chemical compositions from each other. While the first and second stacked fin portions 310, 320 are each shown to include two layers of channel material 305, 306, only a single layer may be used. The first stacked fin portion 310 may be used to provide an NMOS device for example, while the second stacked fin portion 320 may be used to form a PMOS device as discussed further below.

Figure 1B:
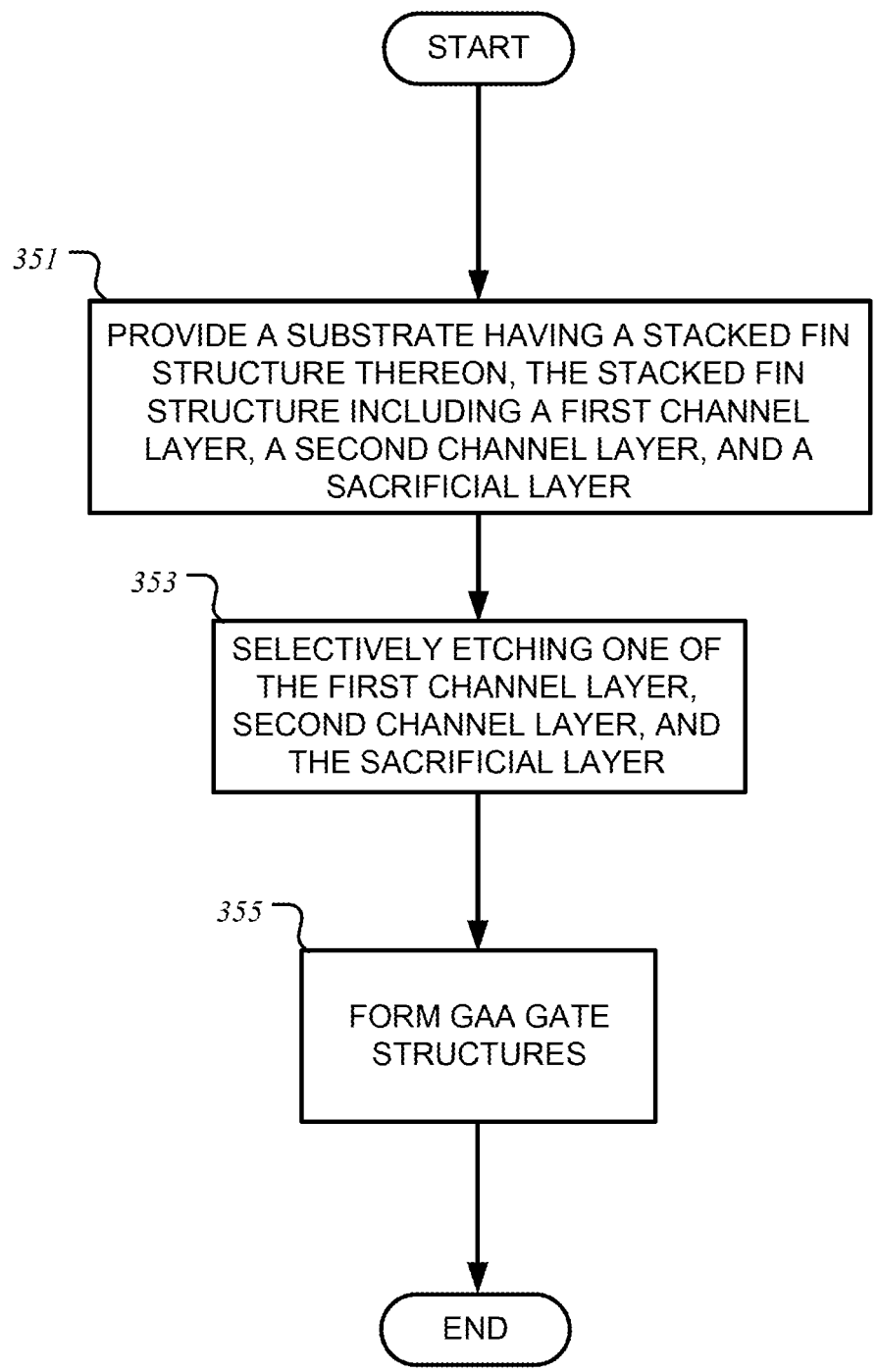
FIG. 1B shows a process flow of a method of manufacturing a semiconductor device according to an embodiment of the disclosure.

FIG. 1B shows a process flow for a method of manufacturing a semiconductor device. As seen, the process includes step 351 of providing a semiconductor substrate having a base fin structure 303 thereon, the base fin structure 303 including a first stacked fin portion 310 having at least one first channel material 305, a second stacked fin portion 320 having at least one second channel material 306, and a sacrificial material 307. The first stacked fin portion 310 is used for forming a channel of a first gate-all-around (GAA) transistor, and the second stacked fin portion 320 is used for forming a channel of a second GAA transistor. The first stacked fin portion 310 includes an initial volume of first channel material 305 provided between upper and lower portions of sacrificial material 307 such that the first channel material 305 and sacrificial material 307 are exposed at a side of the first stacked fin structure 310. The second stacked fin portion 320 includes an initial volume of second channel material 306 provided between upper and lower portions of sacrificial material 307 such that the second channel material 306 and sacrificial material 307 are exposed at a side of the second stacked fin structure 320.

In step 353, the initial volume of the second channel material 306 is selectively reduced relative to the initial volume of first channel material 305 by a predetermined amount via, for example, an isotropic etch. Such reduction can be performed by etch "trimming" a portion of the initial volume of the second channel material 306. The predetermined amount of volume reduction can yield, for example, a vertically oriented first channel in the first stacked fin portion 310.

In step 355, first and second GAA gate structures are formed around the first channel material 305 and the second channel material 306, respectively. More specifically, the sacrificial material 307 is removed to "release" the first and second channel materials 305, 306. GAA transistor structures are then formed around each of the released channel materials. The first and second GAA structures can be electrically connected such that they are complimentary to each other.

Figure 2A:
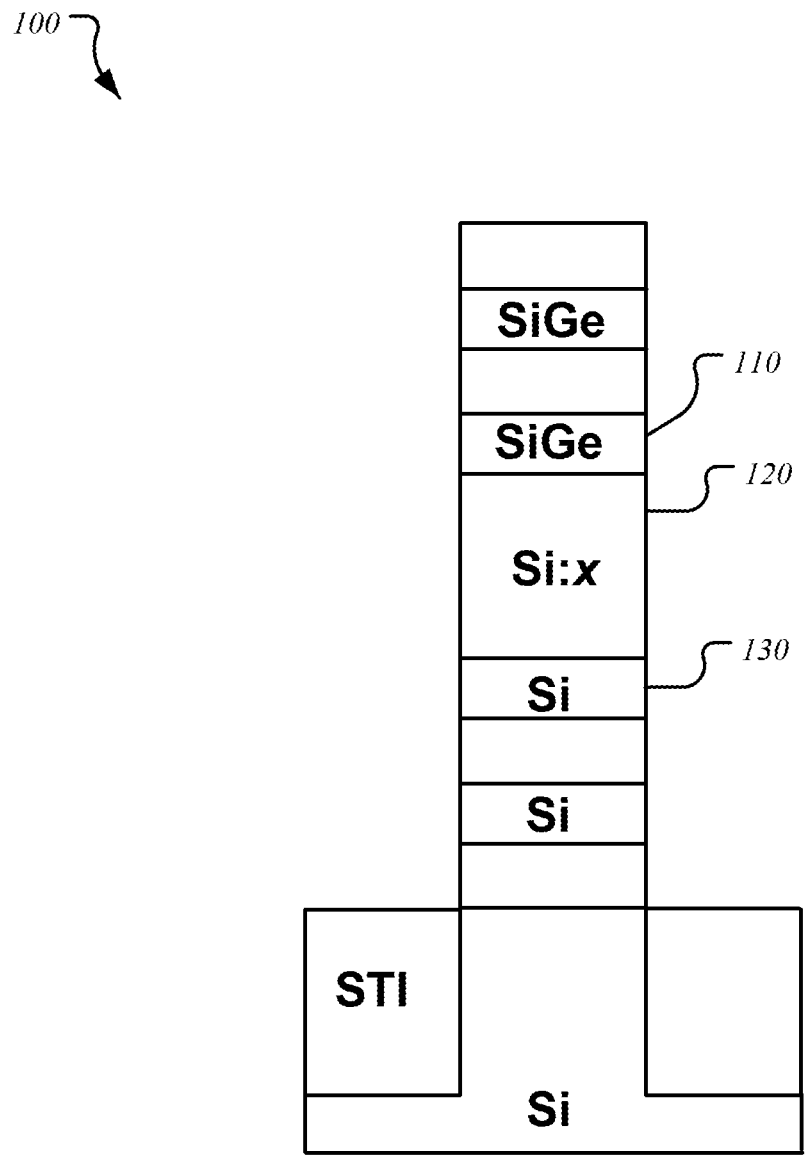
FIG. 2A shows a cross-sectional view of a fin structure with two different channel materials with mask material protecting a set of channels according to an embodiment of the disclosure.

In one embodiment, the first, second, and third materials can have different etch resistivities for a particular etchant. As illustrated in FIG. 2A, a fin stack 100 prior to etching includes a sacrificial material 120, for example Si:B or a doped silicon, a first material for a first type of channel 110, for example SiGe, and a second material for a second type of channel 130, for example Si, with a sacrificial material 120 being a third material. The first type of channel 110 can be disposed above the second type of channel 130 with sacrificial material 120 separating both channels. There can be multiple channels of each type of channel. More specifically, different channel materials can be used for both NMOS and PMOS nanowires or nanosheets. Note that this is non-limiting and many more materials and combinations can be selected. With materials of different etch resistivities, there is no need to cover or block one active channel type area because the etch resistivities themselves will protect complementary and bulk materials from being etched (etched significantly).

Silicon or SiGe wires or sheets can be produced by releasing of complementary material through a highly selective isotropic etch process. An etch process with sufficient etch selectivity can be executed using a chemical oxide removal (COR) process or other vapor-phase etching process. To fabricate a device designed with multiple channel materials for NMOS and PMOS, a third epitaxially grown material can be used. Such a material can be chosen to have high selectivity to the desired NMOS and PMOS channel materials. This third material can also be an epitaxially grown material such as Ge, or various compositions of SiGe, or can even be P-doped or B-doped versions of silicon or the other epitaxially grown materials mentioned herein.

Figure 2B:
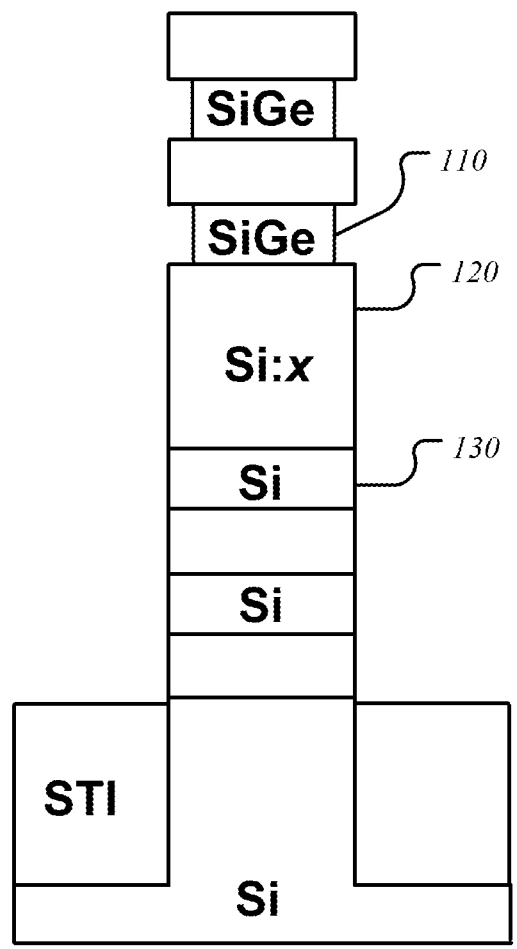
FIG. 2B shows a cross-sectional view of a fin structure with two different channel materials, wherein a top set of channels has been selectively etched an according to an embodiment of the disclosure.

An etch process can be executed that etches one material in the fin stack 100 without etching other materials in the fin stack 100. This etch process includes an isotropic etch to evenly etch in any direction. For example, an isotropic, vapor-phase etch. Such vapor phase etching can have etch selectivity of 100:1 to other epitaxially grown crystal films used in a corresponding fin composition, such as SiGe or doped Si. The fin stack 100 is a fin structure with alternating layers of material with different etch resistivities. As described above, a vapor-phase etch, chemical oxide removal etch, atomic layer etch (ALE) or quasi-ALE etch can be executed. Accordingly, etching results in a lateral etch because sidewalls of the channels are exposed. This selective etch can laterally trim a portion of a given material that is etchable by the particular etchants and process conditions used (chemical compounds, chamber pressure, temperature, etc.). FIG. 2B illustrates a result of an example fin stack 191 after etching via isotropic etch.

After the first etch process, a second etch process can be used to trim the other or complement channel material if needed. Trimming the complementary channel material can be based on device design and layout of a circuit to create a desired transistor delay or to meet a transistor delay tolerance. Trimming the complementary channel material can be executed in situ in a given processing chamber by changing etch chemistry and parameters. An amount of material trimmed can be based on electrical requirements or specifications to balance NMOS and PMOS regions in a vertically stacked configuration of channel materials. An amount to etch for a given channel material can be determined by calculations based on expected transistor delay based on a local area or region of a given device being tuned for relay.

Figure 2C:
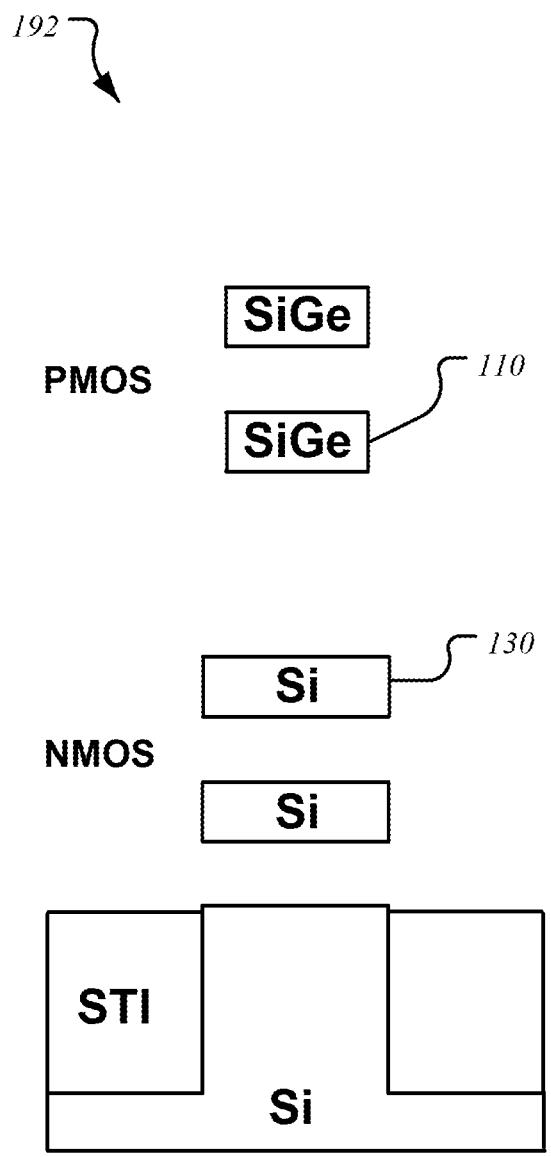
FIG. 2C shows a cross-sectional view of a fin structure with two different channel materials, wherein sacrificial material has been removed according to an embodiment of the disclosure.

FIG. 2C illustrates an example result of a fin stack 192, wherein sacrificial material 120 has been removed. After etching of one or both (or more) channel materials, sacrificial material 120 can then be removed to uncover the channels 110, 130. Sacrificial material 120 can be removed in sections that are uncovered so that nanowires or nanosheets are supported at each end. Such sacrificial material 120 removal can also be executed in the same processing chamber such as a chamber/system that uses vapor-phase etching. Notably, FIG. 2C illustrates the pMOS channel trimmed with respect to nMOS, but it can be appreciated by those in the art that the pMOS channel be wider than the nMOS channel since hole mobility is lower than electron mobility. Thus, either channel can be selectively trimmed with respect to the other depending on the desired result.

Figure 2D:
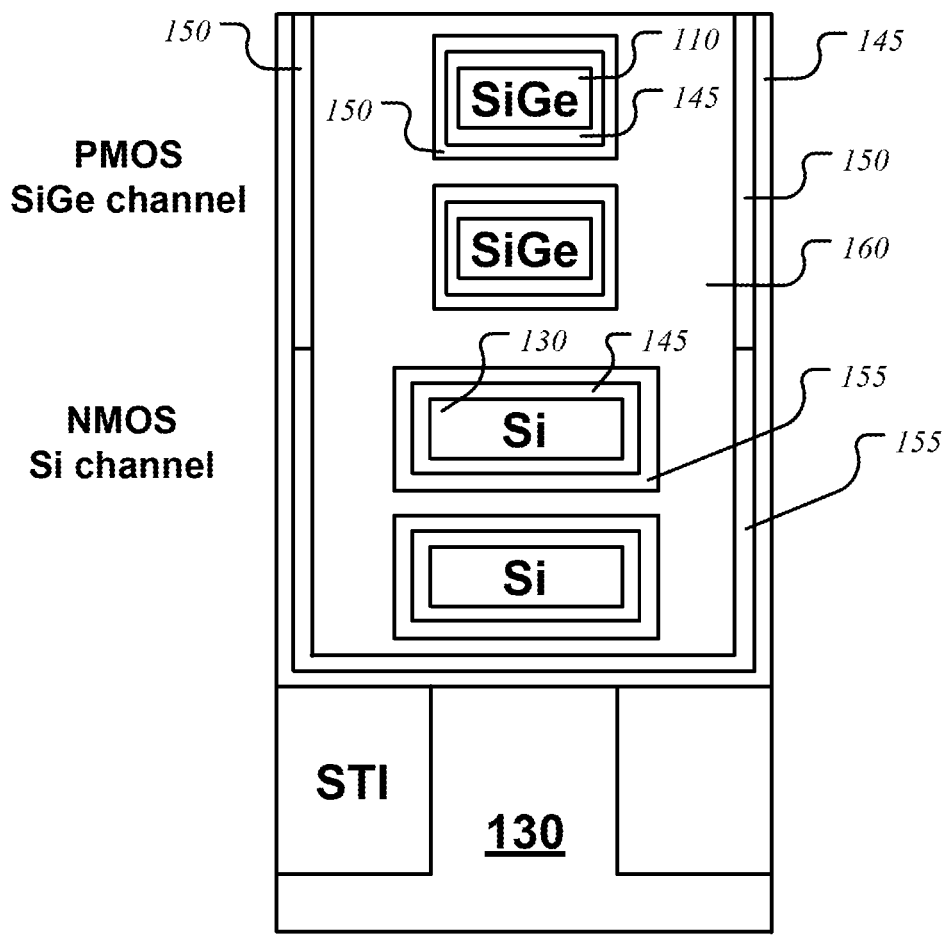
FIG. 2D shows a gate all around transistor device with two different channel materials according to an embodiment of the disclosure.

As illustrated in FIG. 2D, after removal of the bulk fin material, processing can continue to form gate-all-around (GAA) channels such as by depositing a high-k dielectric 145, a first type of channel work-function metal 150, a second type of channel work-function metal 155, and a gate fill metal 160. The high-k dielectric 145 can be, for example, HfO. The high-k dielectric 145 can also include a SiO gate oxide. The first type of channel work-function metal 150 can be, for example, TiN. The second type of channel work-function metal 155 can be, for example, TiAlN or TiAlC. The gate fill metal 160 can be, for example, tungsten, cobalt, or ruthenium. The SiO gate oxide can be deposited around both the first type of channel 110 and the second type of channel 130, the high-k dielectric 145 can be deposited around both the first type of channel 110 and the second type of channel 130, the first type of channel work-function metal 150 can be deposited around the high-k dielectric 145 for the first type of channel 110, the second type of channel work-function metal 155 can be deposited around the high-k dielectric 145 for the second type of channel 130, the first type of channel work-function metal 150 can be deposited around the first type of channel 110, the second type of channel work-function metal 155 can be deposited around the second type of channel 130, and the first type of channel work-function metal 150 can be deposited around both the first type of channel 110 and the second type of channel 130, and then the fill metal 160 can be deposited.

A replacement gate can be patterned around the fin structure and a low-k spacer can be deposited along the side-wall of the replacement gate and along the fin structure. The low-k spacer material can be etched in a manner such that the low-k spacer is only preserved along with sidewall of the replacement gate and removed from the fin structure. The sacrificial material 120 can then be removed in areas between the full replacement gate with low-k spacer sidewall. Thus the physical nanowires or nanosheets, along with the epitaxial material that can act as channel material but can later be released in the nanowire formation process, only exist within the replacement gate and protrude through the low-k spacer.

In another embodiment, fill material within the fin can also not be a channel. Such fill material can be recessed with selectivity to both PMOS and NMOS channel materials. The recess can be executed such that the filling material is recessed sufficiently into a low-k spacer. The low-k spacer can then be re-formed around a cavity left by the recess of the filling epitaxial material. A result is NMOS and PMOS wires or nanosheets that only extend through the low-k spacer material. Source/Drain (S/D) epitaxial growth can then be executed at the ends of the NMOS and PMOS wires or sheets sequentially. With each S/D grown on a given level of the CFET device, a contact or electrode can be patterned and metalized before going up and growing S/D epitaxial material from higher-level nanowires or nanosheets in the device, that is, nanowires or nanosheets farther away from the center of the substrate.

After all S/D epitaxial growths have been executed and all S/Ds formed, and after contact or electrode patterns are formed to connect each S/D level and are metalized, the replacement gate can be opened and the polysilicon or amorphous silicon within the replacement gate can be removed to uncover the fin that is still protected in the replacement gate area by the fin liner. The fin liner can be removed and the filling epitaxial material that is not part of either NMOS or PMOS channel can be etched selectively to the NMOS and PMOS channel materials. A corresponding etch is preferably isotropic to have extremely high selectivity between the filling epitaxial material and the channel materials. Such CFET processing can be completed in which high-k material is deposited within the gate and around the NMOS and PMOS nanowires/nanosheets. High-k dielectric deposition can be followed by subsequent depositions of NMOS and PMOS work function and gate metals.

Figure 3A:
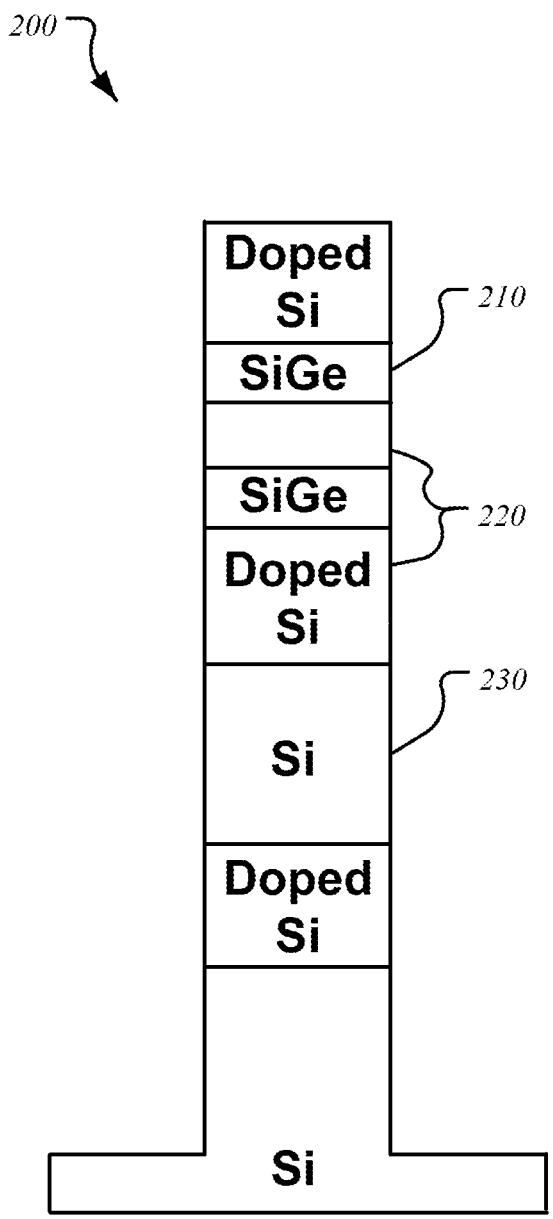
FIG. 3A shows a cross-sectional view of a fin structure with two different channel materials, wherein a bottom channel is fabricated to be thicker than the top set of channels according to an embodiment of the disclosure.

Techniques herein can also include horizontally-oriented PMOS SiGe positioned vertically above vertically-oriented NMOS Si, or the reverse or partial. As illustrated in FIG. 3A, a fin stack 200 includes a sacrificial material 220, for example a doped silicon such as Si:B, a first material for a first type of channel 210, for example SiGe, and a second material for a second type of channel 230, for example Si, with a sacrificial material 220 being a third material. The fin stack 200 can include a thicker silicon layer as compared to the SiGe layers positioned above.

Figure 3B:
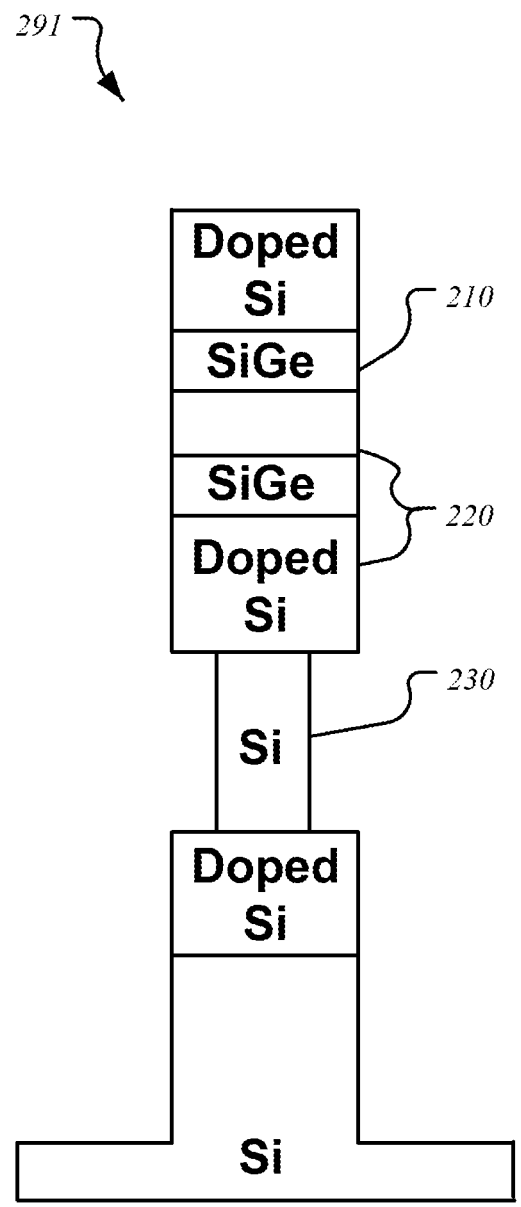
FIG. 3B shows a cross-sectional view of a fin structure with two different channel materials, wherein a bottom channel is etched to produce a vertical channel according to an embodiment of the disclosure.

FIG. 3B illustrates a fin stack 291, wherein a first etch step can be executed that laterally trims the second type of channel 230 (Si NMOS channel), resulting in a narrowed, vertically-oriented nanosheet (the long axis of the nanosheet is perpendicular to the working surface of the substrate or extending in the xy-plane, but a long side of a rectangular cross-section extends in the z-plane). Aspect ratios can be configured to prevent any instability with a laterally trimmed nanosheet. Etch durations can be calculated to etch over a second predetermined amount of time that can yield the predetermined aspect ratios for the vertical channel.

Figure 3C:
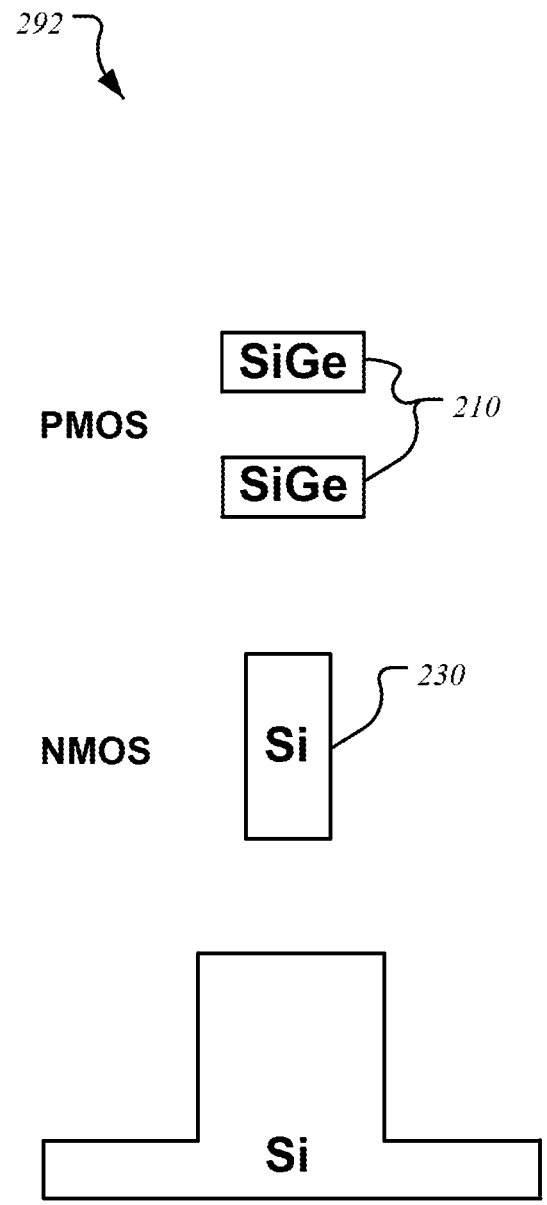
FIG. 3C shows a cross-sectional view of a fin structure with two different channel materials, wherein a channel has been etched to produce a vertical channel and sacrificial material has been removed according to an embodiment of the disclosure.

FIG. 3C illustrates an example result of a fin stack 292, wherein sacrificial material 220 has been removed. After etching of one or both (or more) channel materials, sacrificial material 220 can then be removed to uncover the channels 210, 230. Sacrificial material 220 can be removed in sections that are uncovered so that nanowires or nanosheets are supported at each end. Such sacrificial material 220 removal can also be executed in a same processing chamber such as a chamber/system that uses vapor-phase etching. Such an orientation can improve drive current in some applications.

Figure 3D:
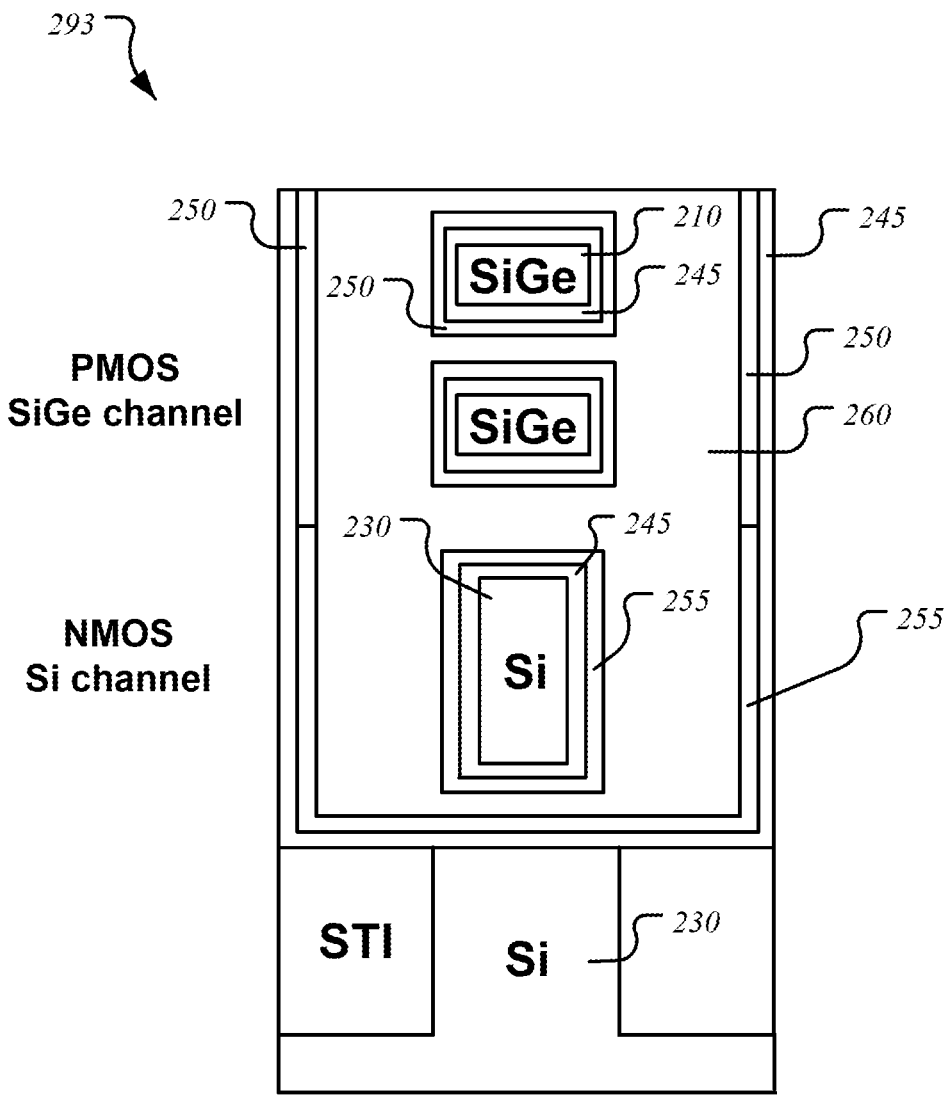
FIG. 3D shows a gate all around transistor device with two different sets of channels, wherein one of the channels is a vertical channel according to an embodiment of the disclosure.

As illustrated in FIG. 3D, after removal of the bulk fin material, processing can continue to form gate-all-around (GAA) channels such as by depositing a high-k dielectric 245, a first type of channel work-function metal 250, a second type of channel work-function metal 255, and a gate fill metal 260. The high-k dielectric 245 can be, for example, HfO. The high-k dielectric 245 can also include a SiO gate oxide. The first type of channel work-function metal 250 can be, for example, TiN. The second type of channel work-function metal 255 can be, for example, TiAlN or TiAlC. The gate fill metal 260 can be, for example, tungsten, cobalt, or ruthenium. The SiO gate oxide can be deposited around both the first type of channel 210 and the second type of channel 230, the high-k dielectric 245 can be deposited around both the first type of channel 210 and the second type of channel 230, the first type of channel work-function metal 250 can be deposited around the high-k dielectric 245 for the first type of channel 210, the second type of channel work-function metal 255 can be deposited around the high-k dielectric 245 for the second type of channel 230, the first type of channel work-function metal 250 can be deposited around the first type of channel 210, the second type of channel work-function metal 255 can be deposited around the second type of channel 230, and the first type of channel work-function metal 250 can be deposited around both the first type of channel 210 and the second type of channel 230, and then the fill metal 260 can be deposited.

In another embodiment, the first type of channel 210 can be vertically oriented relative to the second type of channel 230. This structure can be desired where a larger number of nanowires or nanosheets for pMOS is desired as compared to nMOS, wherein a width of the nanowires/nanosheets may be restricted.

Figure 3E:
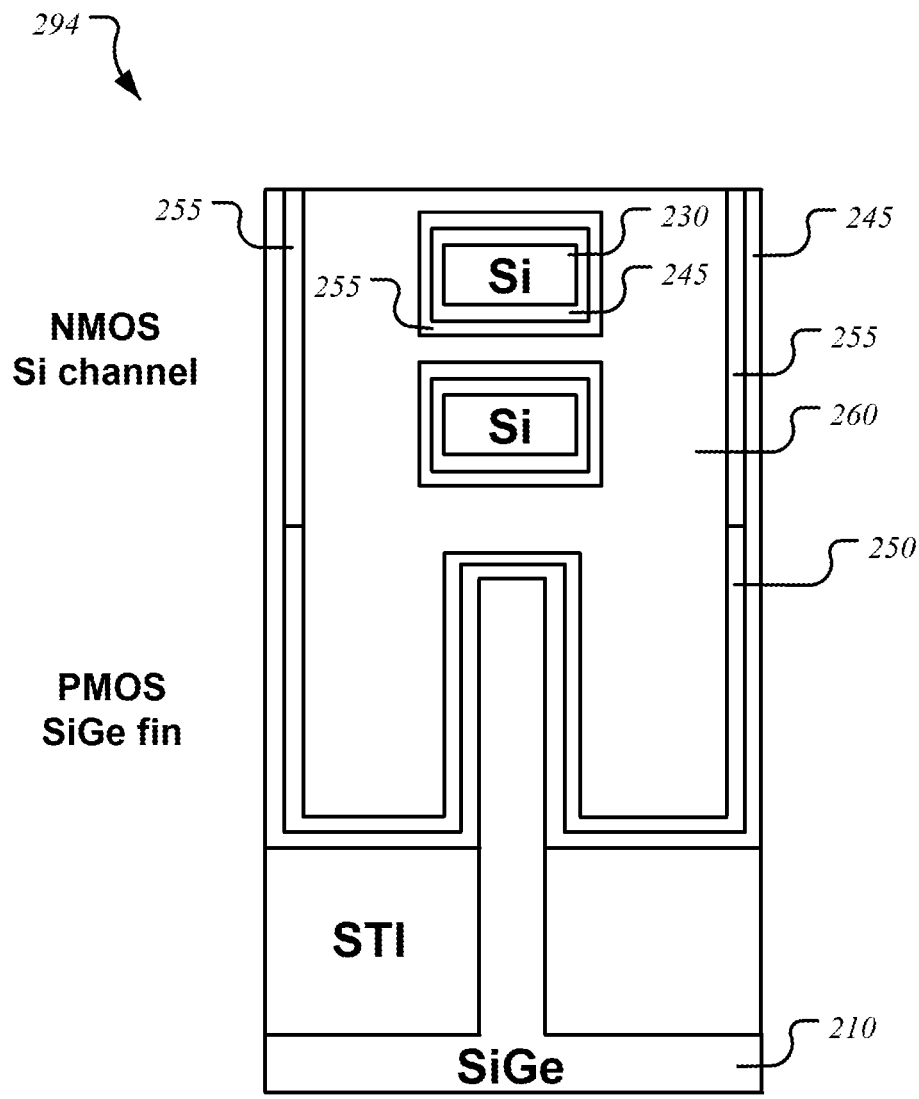
FIG. 3E shows a gate all around transistor device with two different sets of channels, wherein one of the channels is a vertical channel according to an embodiment of the disclosure

In another embodiment, FIG. 3E illustrates an example result of a fin stack 294 wherein the first type of channel 210 is attached to the base of the fin stack 294, forming a very tall channel structure. This can be achieved via epitaxial growth of the first type of channel 210 material to a predetermined height, followed by epitaxial growth of layers of sacrificial material and the second type of channel material 230. A mask can be deposited and an etch can be executed to vertically etch down into the layers of material. Processing can proceed as described in FIG. 3D wherein GAA channels are formed around the second type of channel 230. Notably, benefit of this structure is that the first type of channel 210 can be a fin structure which can be leveraged to control strain.

Figure 4:
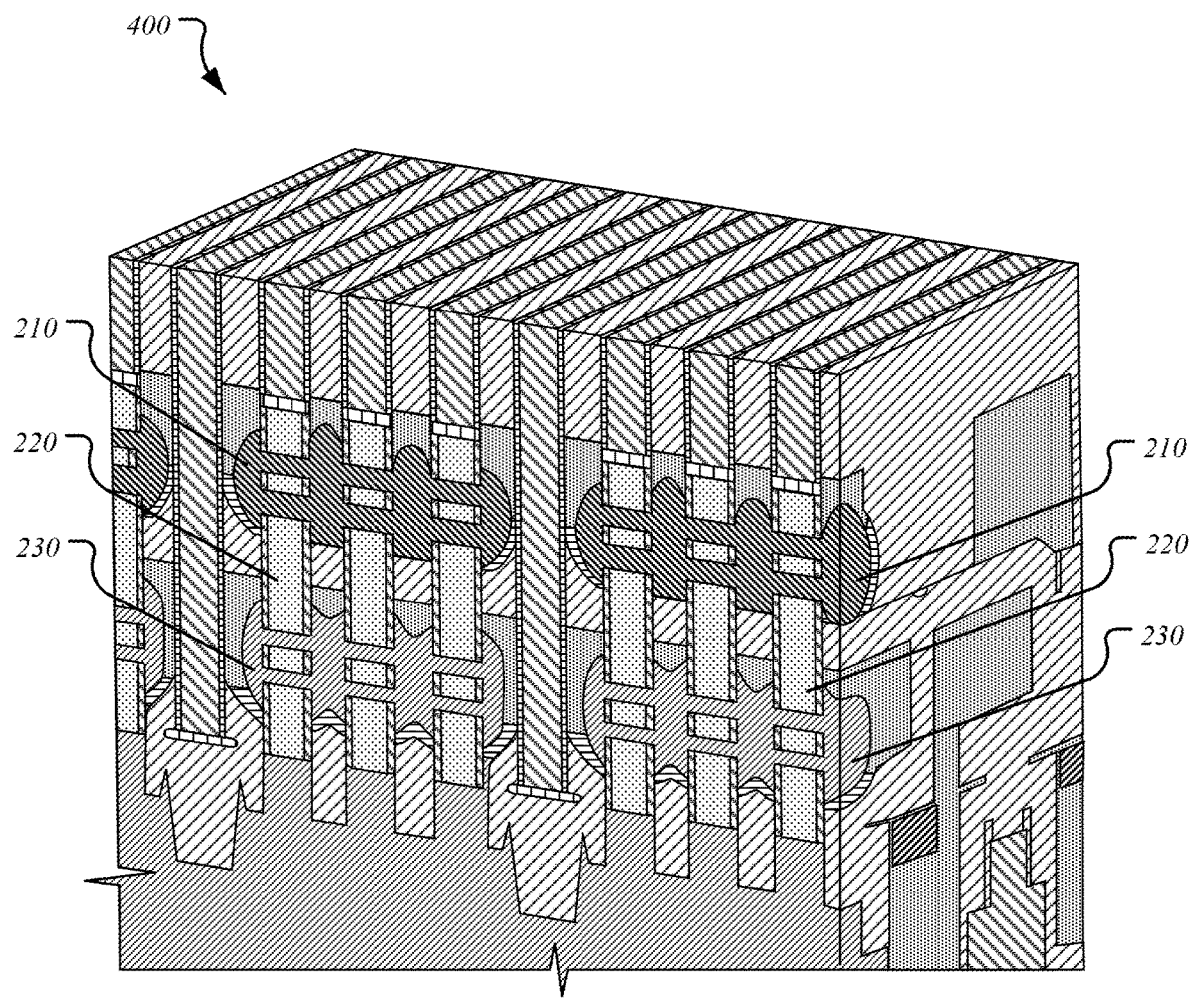
FIG. 4 shows a perspective cross-sectional view of the substrate segment after source/drain and contact metallization according to an embodiment of the disclosure.

FIG. 4 illustrates a perspective cross-sectional view of the substrate segment 400 after source/drain and contact metallization. The first type of channel 210, the sacrificial material 220, and the second type of channel 230 can be seen.

Figure 5:
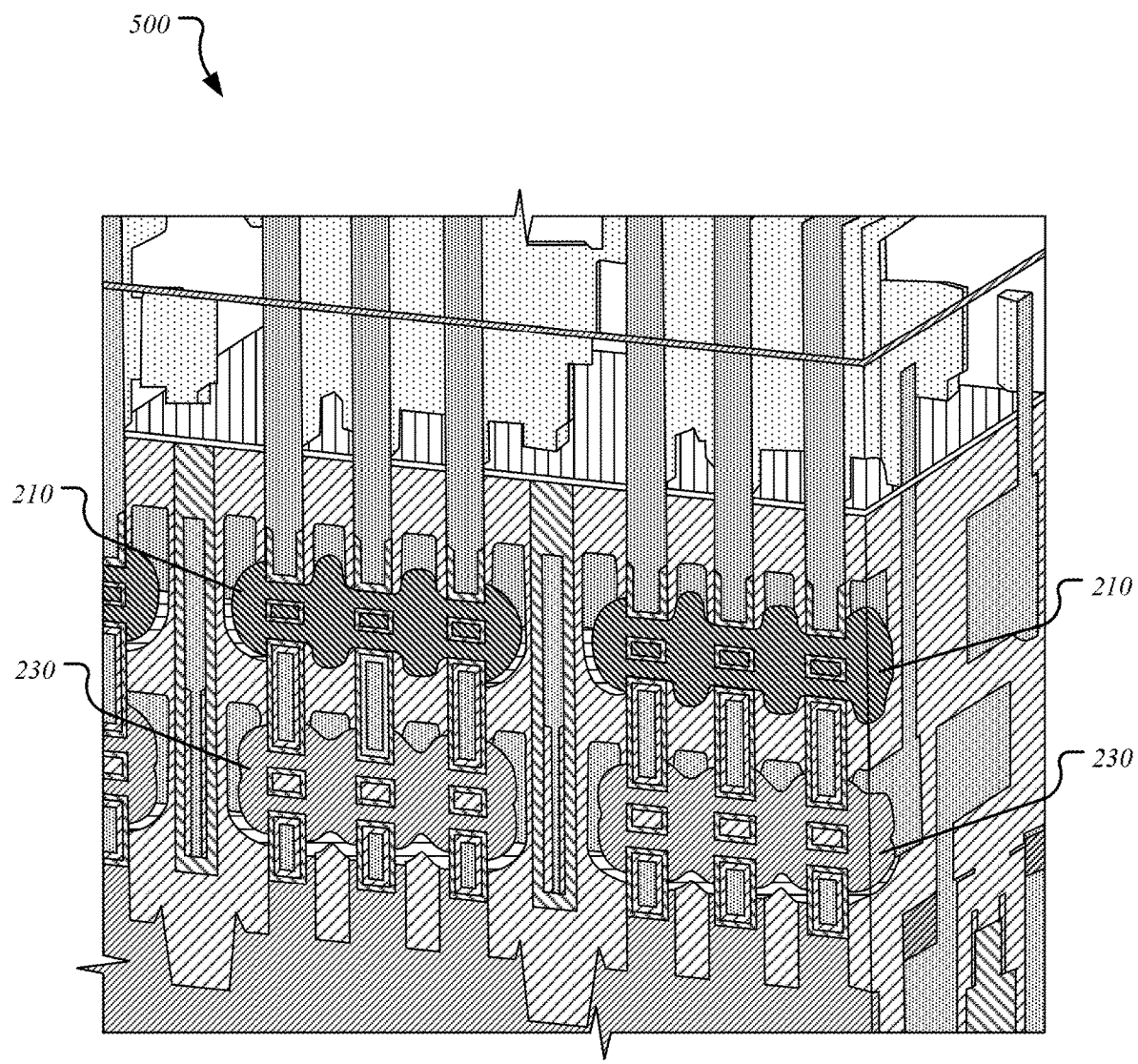
FIG. 5 shows a perspective cross-sectional view of the substrate segment after removal of doped silicon (or other spacer/fill) and after gate metallization according to an embodiment of the disclosure.

FIG. 5 illustrates a perspective cross-sectional view of a substrate segment 500 after removal the sacrificial material 220 and other fill materials, and after gate metallization. Notably, the selection of metal for the contact can introduce addition strain along the channels. Metals such as Ru can undergo recrystallization at high-thermal processes such as S/D anneals which can put additional strain along the channels.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

What is claimed is:
1. A method of manufacturing a semiconductor device comprising:
 providing a substrate having a base fin structure thereon, the base fin structure comprising:
  a first stacked portion for forming a channel of a first gate-all-around (GAA) transistor, the first stacked portion comprising first channel material, a second stacked portion for forming a channel of a second GAA transistor, the second stacked portion comprising second channel material, and a sacrificial portion including a sacrificial material, the sacrificial portion separating the first stack portion from the second stack portion such that the first channel material, second channel material and the sacrificial material are exposed at a side of the base fin structure, wherein the first channel material, the second channel material and the sacrificial material have different chemical compositions from each other;

exposing the side of the base fin structure to an isotropic etch process which selectively etches one of the first channel material and the second channel material;

removing the sacrificial material such that the first channel material remains in the first stacked portion and the second channel material remains in the second stacked portion; and forming first and second GAA gate structures around said first channel material and said second channel material respectively.

2. The method of claim 1, wherein said first channel material is Si, said second channel material is SiGe and said sacrificial material is doped Si.

3. The method of claim 2, wherein said first channel material provides an NMOS channel and the second channel material provides a PMOS channel.

4. The method of claim 1, wherein said exposing comprises selectively etching the first channel material in the width direction relative to the second channel material and the sacrificial material to form a vertically oriented first channel portion.

5. The method of claim 4, wherein said first channel portion is a single layer of said first channel material and said second channel portion is a single layer of said second channel material, the layer of first channel material being thicker than the layer of second channel material along said height direction.

6. The method of claim 4, wherein said first channel portion is a single layer of said first channel material and said second channel portion comprises a plurality of layers of said second channel material separated from each other by a layer of said sacrificial material in the height direction, the single layer of first channel material being thicker than any layer of the second channel material along said height direction.

7. The method of claim 1, wherein said first stacked portion comprises a plurality of layers of said first channel material separated from each other by a layer of said sacrificial material in the height direction, and said second stacked portion comprises a plurality of layers of said second channel material separated from each other by a layer of said sacrificial material in the height direction.

8. The method of claim 1, further comprising cutting said fin structure along a length of said fin structure to form a plurality of separate fin structures each having a cut end which exposes ends of the first channel material, the second channel material and the sacrificial material.

9. The method of claim 8, further comprising depositing a gate spacer dielectric material in the recess.

10. The method of claim 1, wherein said removing comprises selectively etching away all of the sacrificial material relative to the first channel material and the second channel material such that the first and second channel materials are released from the fin structure.

11. The method of claim 1, wherein said forming gate structures comprises:

forming a first gate structure surrounding the first channel portion, and forming a second gate structure surrounding the second channel portion.

12. The method of claim 11, wherein said forming a first gate structure comprises:

forming an NMOS gate structure around the first channel portion, and forming a PMOS gate structure around the second channel portion.

13. The method of claim 12, further comprising electrically connecting the NMOS gate structure to the PMOS gate structure as complementary complementary transistors.

14. A semiconductor device comprising:

a substrate having a planar surface;

a first FET provided on said substrate and having a first channel structure, the first channel structure having a height and a width, the height of the first channel structure being measured along a dimension perpendicular to a plane of the substrate and the width of the first channel structure being measured along a dimension parallel to the plane of the substrate;

a second FET vertically stacked on said first FET along the height direction perpendicular to the plane of the substrate, the second FET having a second channel structure, the second channel structure having a height and a width, the height of the second channel structure being measured along the dimension perpendicular to the plane of the substrate and the width of the second channel structure being measured along the dimension parallel to the plane of the substrate;

a first gate structure provided all around said first channel structure; and a second gate structure provided all around said second channel structure, wherein the width of the first channel structure is narrower than the width of the second channel structure, and the height of the first channel structure is larger than the width of the first channel structure.

15. The semiconductor device of claim 14, wherein said first channel structure is a single vertically oriented channel.

16. The semiconductor device of claim 14, wherein said second channel structure comprises a plurality of stacked horizontally oriented channels.

17. The semiconductor device of claim 14, wherein said first channel is an nFET channel and said second channel is a pFET channel.

18. The semiconductor device of claim 14, wherein said first channel is a pFET channel and said second channel is an nFET channel.

19. The semiconductor device of claim 14, wherein said first channel structure is formed of Si and said second channel structure is formed of SiGe.

* * * * *

UNITED STATES PATENT AND TRADEMARK OFFICE
CERTIFICATE OF CORRECTION

PATENT NO. : 10,685,887 B2
APPLICATION NO. : 16/204606
DATED : June 16, 2020
INVENTOR(S) : Jeffrey Smith et al.

It is certified that error appears in the above-identified patent and that said Letters Patent is hereby corrected as shown below:

On the Title Page

In Column 1, item (54), Title, Line 3, delete "COMPLIMENTARY" and insert
-- COMPLEMENTARY --, therefor.

In the Specification

In Column 1, Line 3, delete "COMPLIMENTARY" and insert -- COMPLEMENTARY --, therefor.

In the Claims

In Column 12, Line 20 (approx.), Claim 13, delete "complementary complementary" and insert -- complementary --, therefor.

Signed and Sealed this
Twenty-fifth Day of August, 2020

Andrei Iancu
*Director of the United States Patent and Trademark Office*